United States Patent
Bailey et al.

(10) Patent No.: US 10,925,185 B1
(45) Date of Patent: Feb. 16, 2021

(54) MODULAR DATA CENTER WITH INTEGRATED RETURN AIR PLENUM FOR EXTERNAL SIDE-MOUNTED AIR COOLING UNIT

(71) Applicant: DELL PRODUCTS, L.P., Round Rock, TX (US)

(72) Inventors: Mark M. Bailey, Round Rock, TX (US); Trey S. Wiederhold, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/714,381

(22) Filed: Dec. 13, 2019

(51) Int. Cl.
*H05K 7/14* (2006.01)
*H05K 7/20* (2006.01)

(52) U.S. Cl.
CPC ....... *H05K 7/20754* (2013.01); *H05K 7/1497* (2013.01); *H05K 7/2059* (2013.01); *H05K 7/20145* (2013.01); *H05K 7/20836* (2013.01)

(58) Field of Classification Search
CPC .. H05K 7/1497; H05K 7/20145; H05K 7/202; H05K 7/2059; H05K 7/20736; H05K 7/20745; H05K 7/20754; H05K 7/20836
See application file for complete search history.

(56) References Cited

U.S. PATENT DOCUMENTS

| | | | |
|---|---|---|---|
| 9,750,164 B2 | 8/2017 | Roy | |
| 9,814,160 B2 | 11/2017 | Slessman et al. | |
| 9,986,652 B1 | 5/2018 | Roy | |
| 10,058,013 B2 | 8/2018 | Schmitt et al. | |
| 10,107,518 B2 | 10/2018 | Bailey et al. | |
| 2008/0285232 A1* | 11/2008 | Claassen | H05K 7/20745 361/694 |
| 2009/0117843 A1* | 5/2009 | Palmer | F24F 11/0001 454/239 |
| 2009/0301123 A1* | 12/2009 | Monk | H05K 7/1497 62/259.2 |
| 2010/0170277 A1* | 7/2010 | Schmitt | H05K 7/1497 62/259.2 |
| 2010/0263825 A1* | 10/2010 | Noteboom | H05K 7/2079 165/47 |
| 2015/0237768 A1* | 8/2015 | Endo | G05B 15/02 361/679.49 |
| 2017/0367223 A1* | 12/2017 | Bailey | E04H 5/00 |

* cited by examiner

*Primary Examiner* — Jacob R Crum
(74) *Attorney, Agent, or Firm* — Isidore PLLC

(57) ABSTRACT

A modular data center (MDC) has a cooling unit externally positioned proximate to a first longitudinal external wall of a volumetric container. The cooling unit directs supply air sideways through a supply air opening into a cold aisle adjacent to the first longitudinal external wall. The cooling air passes through rack(s) containing information technology (IT) components to a hot aisle. A baffle positioned within the volumetric container above the rack(s) directs return air from the hot aisle through a return air plenum to a return air opening in the first longitudinal external wall. A shroud coupled to at least one of the volumetric container and the cooling unit receives the sideways directed return air and directs the return air downward into an upwardly open return air inlet of the cooling unit.

14 Claims, 12 Drawing Sheets

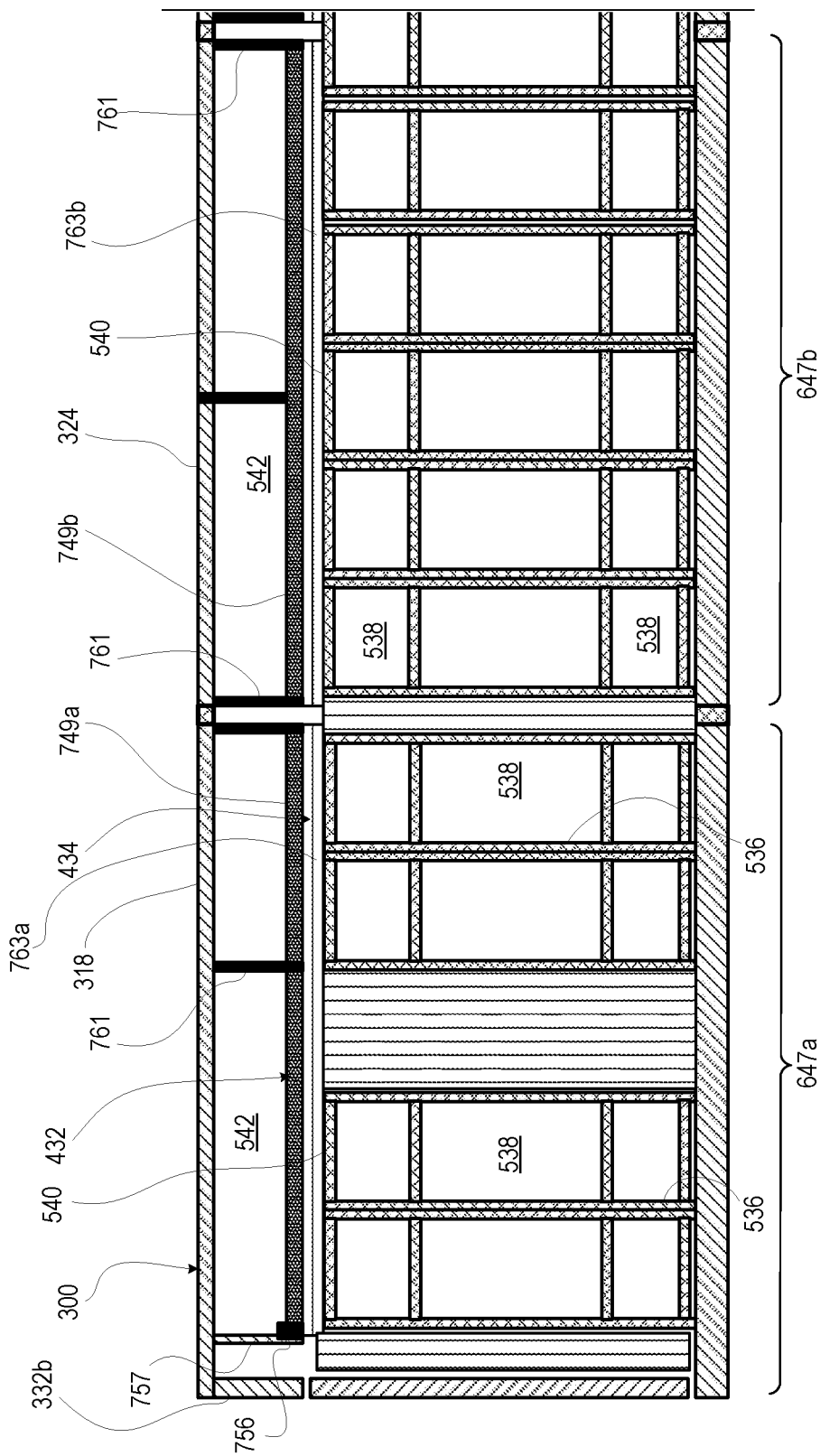

US 10,925,185 B1

MODULAR DATA CENTER WITH INTEGRATED RETURN AIR PLENUM FOR EXTERNAL SIDE-MOUNTED AIR COOLING UNIT

BACKGROUND

1. Technical Field

The present disclosure generally relates to modular data centers (MDCs) and in particular to MDCs having external cooling units.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A modular data center (MDC) contains data center equipment such as information handling systems, storage, and networking equipment that are typically housed in a volumetric container that is transported to a desired location. An MDC typically also includes power and cooling systems. The data center equipment, such as components of the information handling systems, are housed within one or more racks positioned between a cold aisle and a hot aisle of the volumetric container. Cooling air is moved through the MDC by a cooling system. Mounting the cooling system on the roof of the MDC is more expensive than side mounting. However, the hot and cold aisles are on opposite sides of the MDC. The cooling system requires the ability to draw the warmed return air from the hot aisle and to push supply air to the cold aisle.

BRIEF SUMMARY

Disclosed are a modular data center (MDC), a method of assembling an MDC with a side-mounted cooling system having an upwardly open return air inlet, and a method of cooling the MDC using the side-mounted cooling system with an upwardly open return air inlet.

According to one embodiment, an MDC has a volumetric container including a first and a second longitudinal exterior wall and an enclosing upper barrier attached between respective upper surfaces of the first and the second longitudinal exterior walls. Interior spaces extending along the first and second longitudinal exterior walls respectively define a cold aisle and a hot aisle. The first longitudinal exterior wall defines the cold aisle and includes: (i) a first supply air opening; and (ii) a first return air opening vertically positioned above the first supply air opening within the first longitudinal exterior wall. Heat-generating information technology (IT) component(s) are provided within rack(s) that are positioned longitudinally within the volumetric container between the cold aisle and the hot aisle. The rack(s) holding the heat-generating IT component(s) have a top surface that is lower than the enclosing upper barrier of the volumetric container, leaving an air space above the rack(s). A baffle is positioned above a top surface of the rack(s) and is coupled to the volumetric container beneath the enclosing upper barrier of the volumetric container. The baffle and the upper barrier of the volumetric container define a return air plenum. The baffle is coupled to and extends along the first longitudinal exterior wall, separating the first supply air opening and the first return air opening. The baffle extends over the cold aisle and the rack(s). The return air plenum is in fluid communication with the hot aisle, directing return air between an upper portion of the hot aisle and the first return air opening. A first cooling unit is externally positioned proximate to the first longitudinal external wall of the volumetric container. The first cooling unit has a supply air outlet that is sideways directed into the first supply air opening of the volumetric container. The first cooling unit has a return air inlet that is upwardly open. A first shroud is in fluid communication with an interior space of the volumetric container and the first cooling unit. The first shroud is coupled to extend from the volumetric container and over the return air inlet of the first cooling unit. The first shroud directs return air from the return air plenum via the first return air opening to the return air inlet of the first cooling unit.

According to a next embodiment, a method includes defining within a volumetric container a cold aisle adjacent to a first longitudinal exterior wall and a hot aisle adjacent to a second longitudinal exterior wall, opposed from the first longitudinal exterior wall. The first longitudinal exterior wall includes a first supply air opening and a first return air opening that is vertically positioned above the first supply air opening within the first longitudinal exterior wall. The method includes positioning rack(s) longitudinally within the volumetric container between the cold aisle and the hot aisle. The rack(s) has a top surface that is lower than an upper barrier of the volumetric container, leaving an air space above the rack(s). The method includes installing a baffle within the volumetric container in a position extending from above the top surface of the rack(s) to physically attach to the first longitudinal exterior wall. The baffle physically separates the first supply air opening and the first return air opening. The baffle extends over the cold aisle and the rack(s). A space above the baffle provides a return air plenum in fluid communication with the hot aisle, directing return air between an upper portion of the hot aisle and the first return air opening. The method includes positioning a first cooling unit externally proximate to the first longitudinal external wall of the volumetric container. The first cooling unit has a supply air outlet that is sideways directed into the first supply air opening of the volumetric container. The first cooling unit has a return air inlet that is upwardly open. The method includes coupling a first shroud to extend from the return air opening at the first longitudinal exterior wall of the volumetric container to above the return air inlet of the first cooling unit. The first shroud provides fluid communication between the volumetric container and the first cooling unit. The first shroud directs return air from the return air plenum via the first return air opening to the return air inlet of the first cooling unit.

According to another embodiment, a method includes providing a volumetric container including a first and a second longitudinal exterior wall. The first longitudinal exterior wall defines an exterior barrier of a cold aisle. The first longitudinal wall includes: (i) a first supply air opening; and (ii) a first return air opening vertically positioned above the first supply air opening. The second longitudinal exterior wall defines an exterior barrier of a hot aisle. The method includes determining a cooling requirement of heat-generating IT component(s) that are provided within rack(s). The rack(s) are positioned longitudinally within the volumetric container between the cold aisle and the hot aisle. The rack(s) holding the heat-generating IT component(s) have a top surface that is lower than the enclosing upper barrier of the volumetric container, leaving an air space above the rack(s). The method includes, in response to determining the cooling requirement, operating one or more air movers of a first cooling unit to create a positive pressure differential between a return air inlet that receives return air from first return air opening of the volumetric container and a supply air outlet that is sideways directed to provide supply air to the first supply air opening of the volumetric container. The air movers move the supply air from the cold aisle to the hot aisle to remove heat from the heat-generating IT component(s). The first air return opening is upwardly open. The method includes directing the return air from the hot aisle to the first return air opening in a return air plenum over a baffle. The baffle is installed within the volumetric container in a position above the top surface of the rack(s) to physically separate the first supply air opening and the first return air opening. The baffle extends over the cold aisle and the rack(s). The return air plenum is in fluid communication with the hot aisle. The return air plenum directs return air between an upper portion of the hot aisle and the first return air opening. The method includes directing the return air from the first return air opening of the volumetric container to the return air inlet of the first cooling unit via a first shroud. The first shroud is coupled to extend from the at least one of the volumetric container to above the return air inlet of the first cooling unit, providing fluid communication between the volumetric container and the first cooling unit.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 7C is a front cutaway diagrammatic view depicting the MDC of FIG. 6 having two transportable enclosures, according to one or more embodiments;

DETAILED DESCRIPTION

Figure 1:
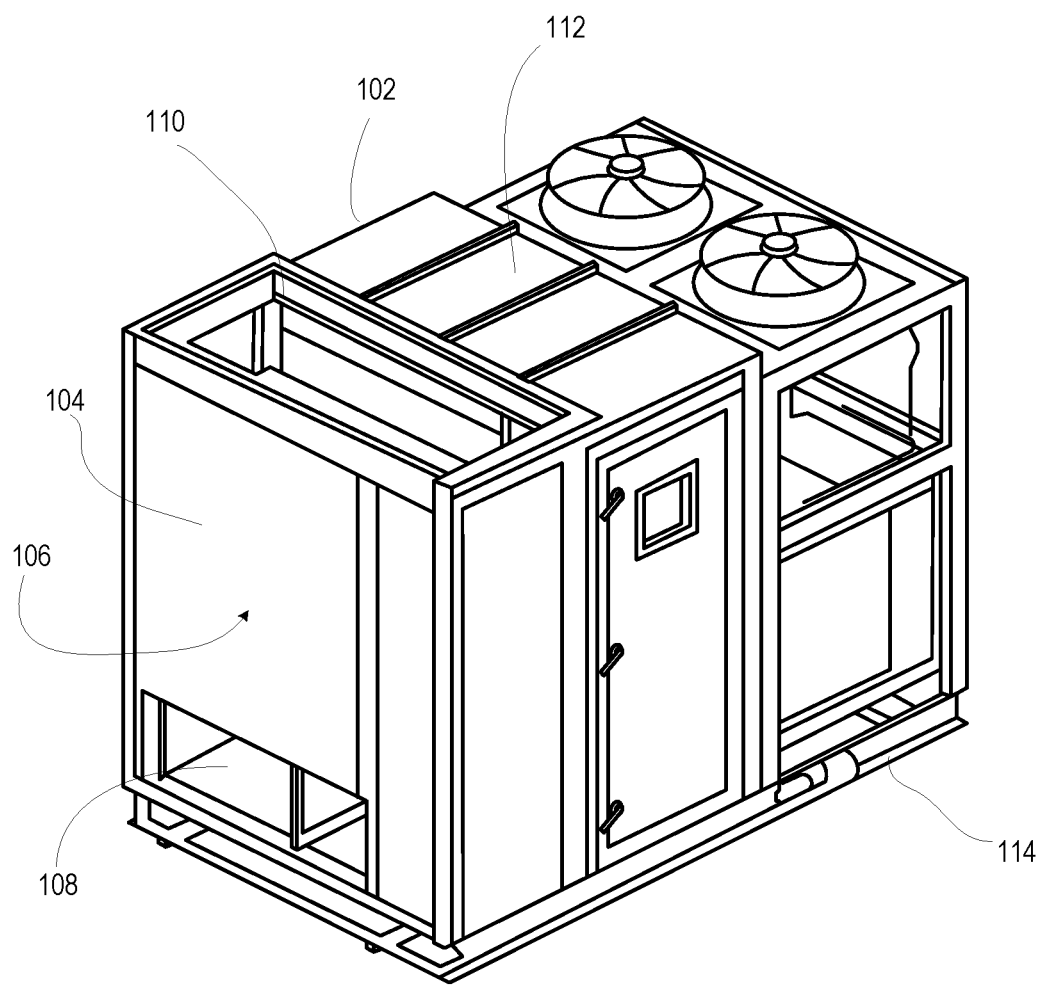
FIG. 1 is a three-dimensional view of an example air cooling unit having a sideways directed supply air outlet and an upwardly open return air opening that is vertically above the supply air outlet, according to one or more embodiments.

The illustrative embodiments provide a modular data center (MDC), a method of assembling an MDC having a side-mounted cooling system with an upwardly open return air inlet, and a method of cooling an MDC using the side-mounted cooling system with an upwardly open return air inlet. The MDC has a cooling unit that is externally positioned proximate to a first longitudinal external wall of a volumetric container. The cooling unit sideways directs supply air through a supply air opening into a cold aisle adjacent to the first longitudinal external wall. The cooling air passes through rack(s) containing heat-generating information technology (IT) components and into a hot aisle. A baffle positioned within the volumetric container and above the rack(s) directs return air from the hot aisle through a return air plenum to a return air opening in the first longitudinal external wall. A shroud in fluid connection with the volumetric container and the cooling unit receives the sideways directed return air and directs the return air downward into an upwardly open return air inlet of the cooling unit.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 depicts a three-dimensional view of example air cooling unit 102 having air handling unit 104 on front side 106. Air handling unit 104 includes side-directed supply air outlet 108 and upwardly open return air inlet 110. Return air inlet 110 is vertically above supply air outlet 108. Air cooling unit 102 includes subsystems for at least one of: (i) mechanical cooling; (ii) heating; and (iii) evaporative cooling, in order to air condition return air received in return air inlet 110. One or more air movers (not shown) in housing 112 propel conditioned air as supply air through supply air outlet 108. In the illustrative embodiment, housing 112 has palletized base frame 114 that enables placement of air cooling unit 102 at a deployed location using a forklift vehicle. The deployed location is where the air cooling unit 102 is operationally used.

Figure 2:
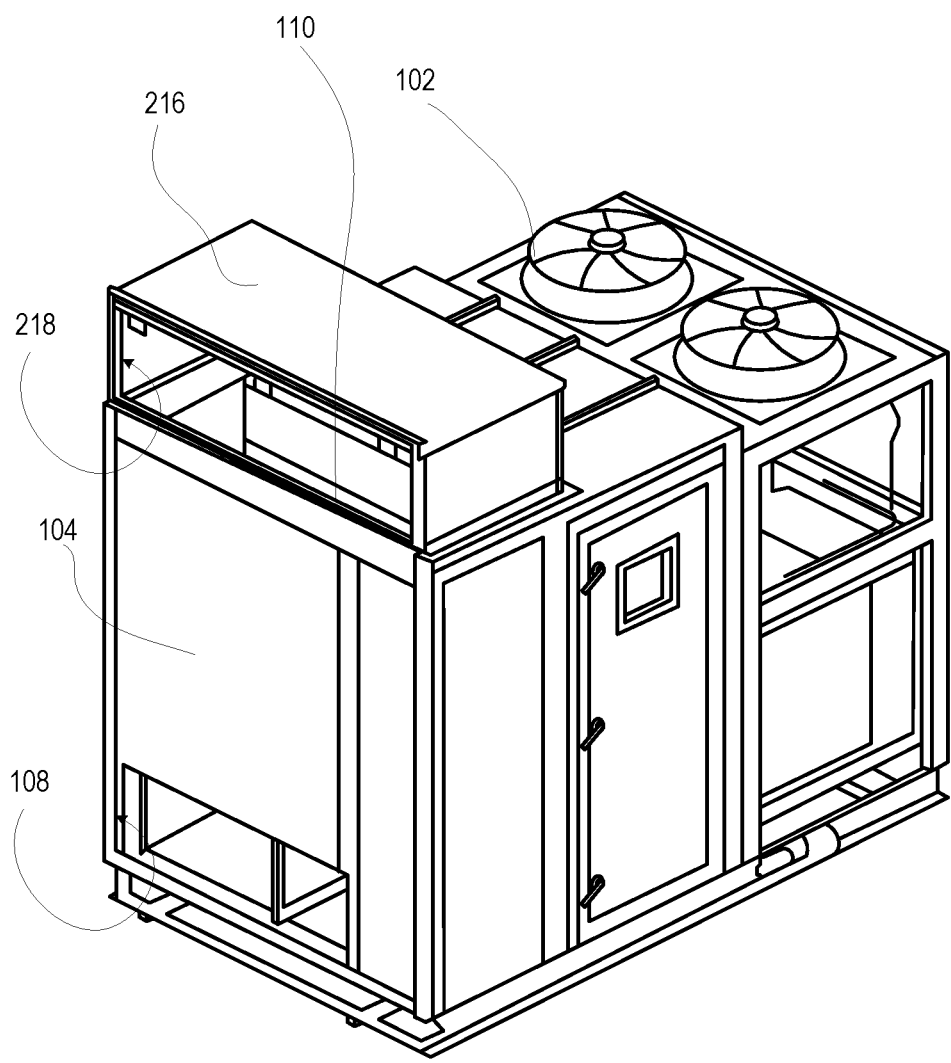
FIG. 2 is a three-dimensional view of the example air cooling unit of FIG. 1 having a shroud attached to redirect return air into the upwardly open return air opening, according to one or more embodiments.

FIG. 2 depicts a three-dimensional view of example air cooling unit 102 having shroud 216. Air cooling unit 102 is positioned at a deployed location. Shroud 216 is a field-installed air duct attached to air cooling unit 102 at the deployed location. Shroud 216 has a vertically aligned rectangular opening 218 that is positioned in planar alignment with supply air outlet 108 of air handling unit 104. Top, right, left and back sides of shroud 216 form a partial enclosure on to redirect the received horizontal return air flow downward into upwardly open return air inlet 110.

Figure 3:
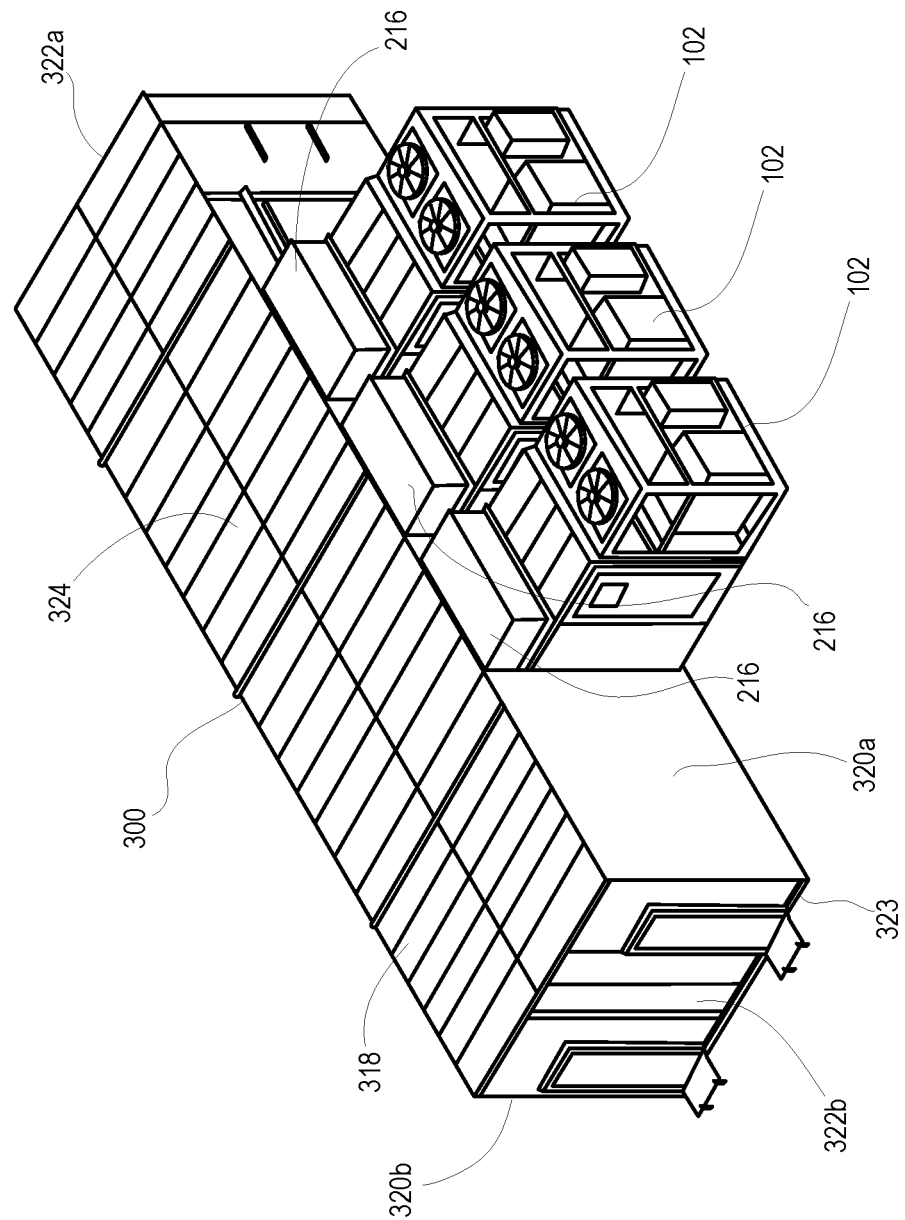
FIG. 3 is a three-dimensional view of a modular data center (MDC) having three side-mounted air cooling units and shrouds of FIG. 2, according to one or more embodiments.

FIG. 3 depicts a three-dimensional view of example MDC 300 having three side-mounted air cooling units 102 each with a shroud 216. MDC 300 has a volumetric container 318 having right and left longitudinal external walls 320a-320b that are longer than front and back lateral external walls 322a-322b, in the illustrative embodiment. In one or more embodiments, upper barrier 324 is attached to and extends across upper portions of external walls 320a-320b, 322a-322b to provide an enclosing roof to volumetric container 318. Floor 323 completes the enclosure of volumetric container 318. Air cooling units 102 are placed side to side against right longitudinal external wall 320a, which is also referred to herein as first longitudinal external wall 320a. Each shroud 216 can be coupled to one or both air cooling units 102 and volumetric container 318 by fasteners or attaching brackets.

Figure 4:
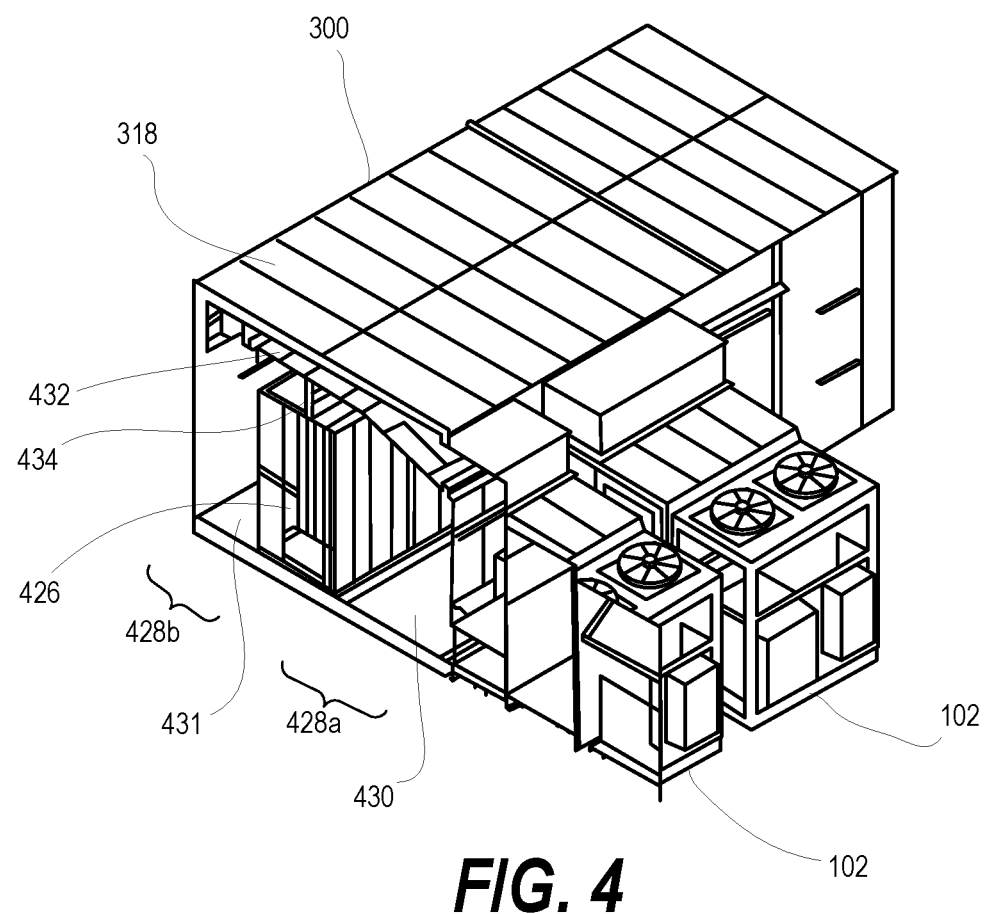
FIG. 4 is a three-dimensional cutaway view of the MDC of FIG. 3 that internally includes information technology (IT) equipment that are cooled with cooling air from air cooling units directed by a return air plenum and the shrouds, according to one or more embodiments.

FIG. 4 depicts a three-dimensional cutaway view of MDC 300, which internally includes IT equipment 426 that are cooled by air cooling units 102. Right interior space 428a of volumetric container 318 adjacent to right longitudinal external wall 320a (which is also referred to herein as first longitudinal external wall 320a) provides cold aisle 430. Left interior space 428b of the volumetric container 318 adjacent to left longitudinal external wall 320b (which is also referred to herein as second longitudinal external wall 320b) provides hot aisle 431. IT equipment 426 separates cold aisle 430 from hot aisle 431. Air is directed through IT equipment 426 by baffle 432 and vertical air barrier 434.

Figure 5:
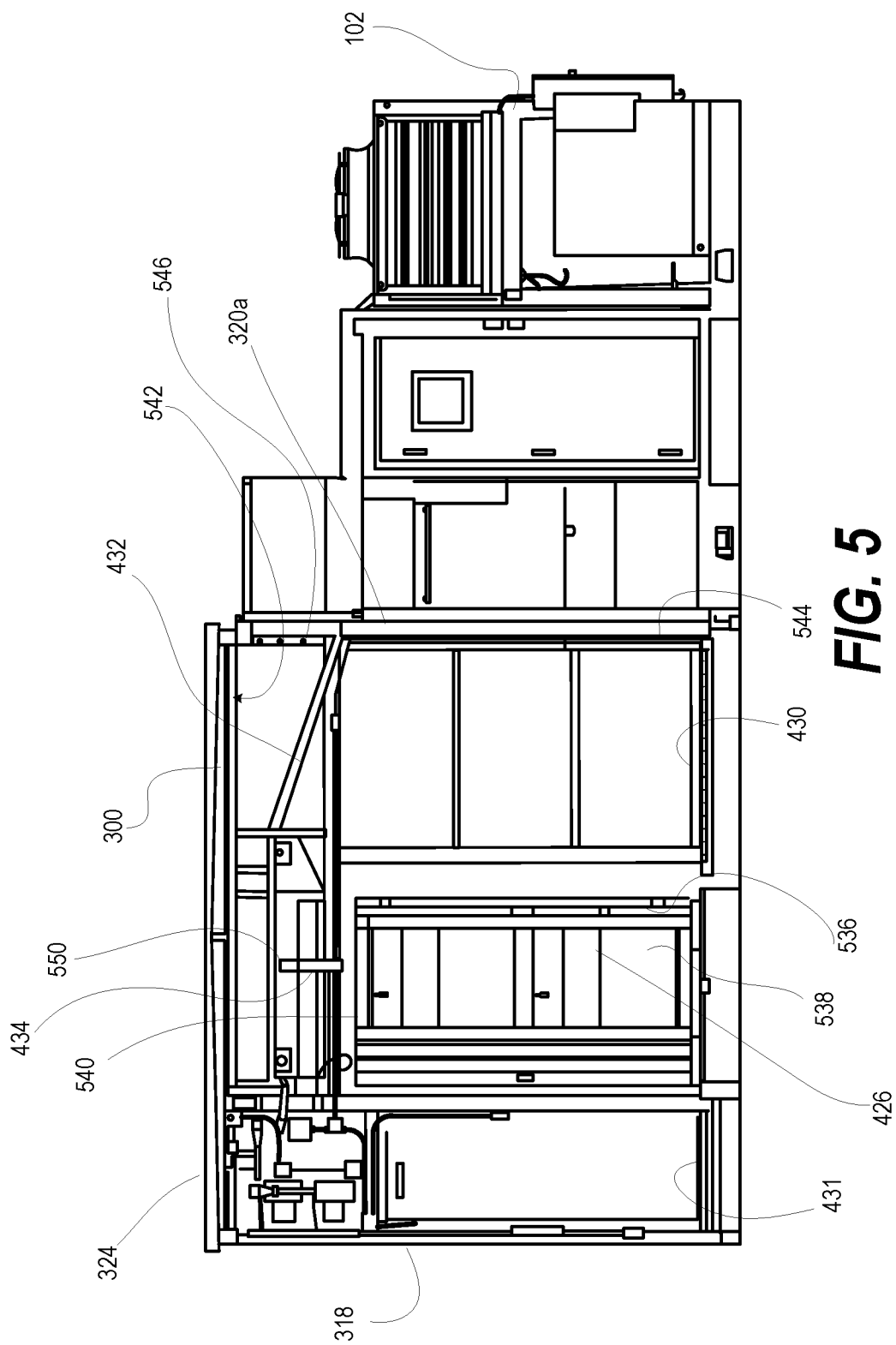
FIG. 5 is a side cutaway view of the MDC of FIG. 4, according to one or more embodiments.

FIG. 5 depicts a side cutaway view of MDC 300 having air cooling unit 102 positioned against volumetric container 318. IT equipment 426 includes rack(s) 536 that hold heat-generating IT component(s) 538 and other components. Heat-generating IT component(s) 538 can include information handling systems for computing and data storage, network communication equipment, and operation technology equipment that provide security, fire suppression, and environmental control. In the illustrative embodiment, a substantially all of baffle 432 is positioned above top surface 540 of rack(s) 536. Baffle 432 is coupled to volumetric container 318 beneath enclosing upper barrier 324. Baffle 432 and upper barrier 324 of volumetric container 318 define return air plenum 542. For clarity, return air plenum 542 is provided by baffle 432 along with interior surfaces of upper barrier 324, which serves as a roof of volumetric container 318. In other embodiments, additional lateral or upper structures that are below the roof can constrain a return air plenum to be a separate duct or funnel shape (not shown). In the illustrative embodiment, baffle 432 is coupled to and extends along first longitudinal exterior wall 320a, separating first supply air opening 544 and first return air opening 546 both provided in first longitudinal exterior wall 320a. Baffle 432 extends over cold aisle 430 and rack(s) 536. Return air plenum 542 is in fluid communication with hot aisle 431, directing return air between an upper portion of hot aisle 431 and first return air opening 546. Vertical air barrier 434 is positioned to top surface 540 of rack(s) 536 and underside 550 of baffle 432. Vertical air barrier 434 blocks cooling air from passing from cold aisle 430 to hot aisle 431 above rack(s), causing the cooling air to be directed through the rack(s) over heat-generating IT component(s) 538.

Figure 6:
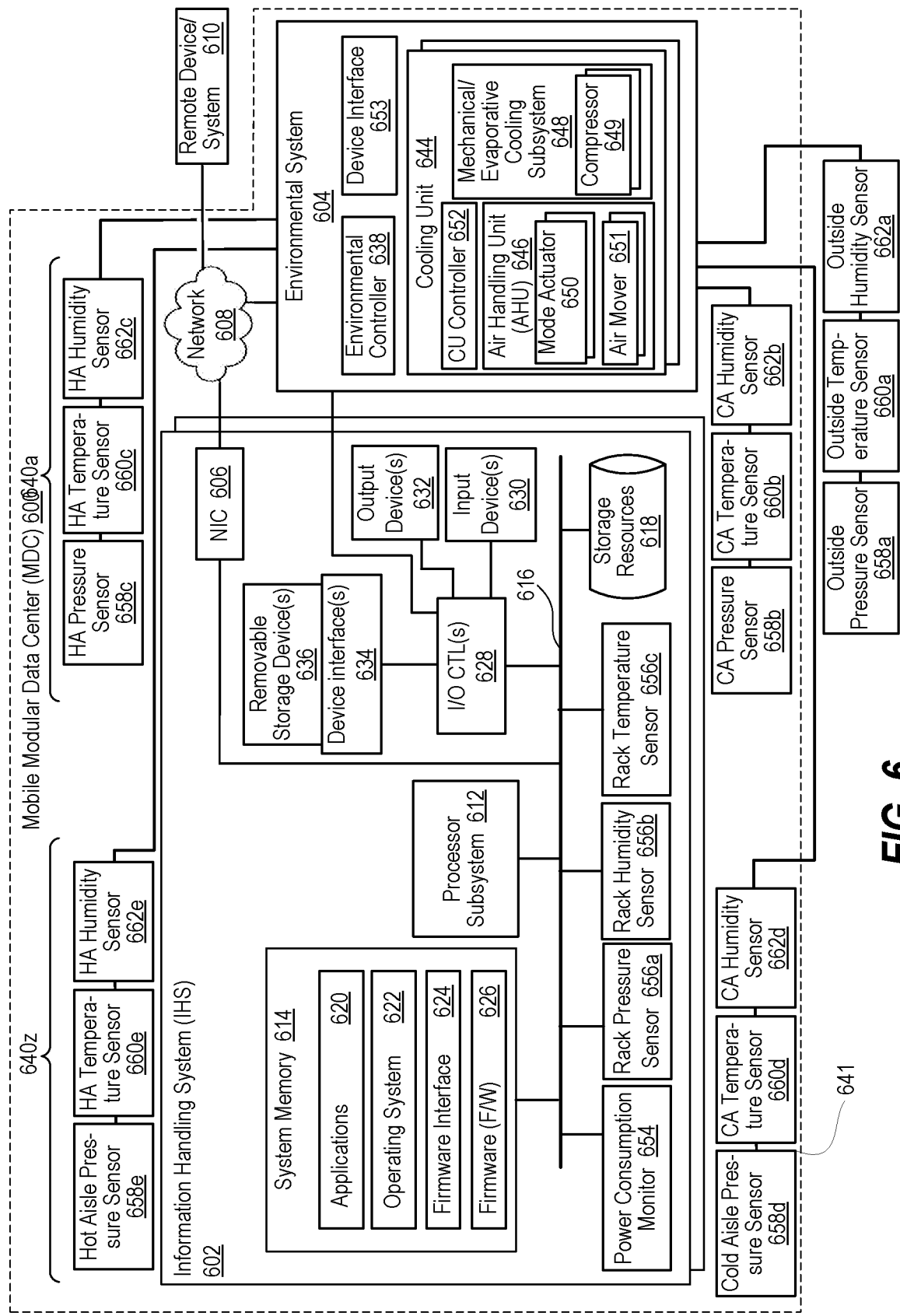
FIG. 6 is a simplified functional block diagram illustrating an MDC having information handling systems (IHSs) that are air cooled by side-mounted cooling units, according to one or more embodiments.

FIG. 6 depicts a simplified functional block diagram of MDC 600 having IT components such as information handling systems (IHSs) 602 with environmental sensors used to control environmental system 604. Within the general context of IHSs, IHS 602 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 602 may be a server, blade server, rack-mounted server, rack-mounted data storage, or other rack-mounted IT equipment. IHS 602 may include random access memory (RAM), one or more processing resources such as a central processing unit (CPU) or hardware or software control logic, read only memory (ROM), and/or other types of nonvolatile memory. Additional components of the IHS 602 may include one or more disk drives, one or more network ports for communicating with external devices as well as various input and output (I/O) devices, such as a keyboard, a mouse, and a video display. The IHS 602 may also include one or more buses operable to transmit communications between the various hardware components. In one or more embodiments, IHS 602 is rack-mounted to provide computing, communication and storage functionality in mobile MDC 600.

IHS 602 includes a network interface, depicted as network interface controller (NIC) 606, in communication via network 608 for receiving IHS updates and work requests from remote devices and systems 610. NIC 606 enables IHS 602 and/or components within IHS 602 to communicate and/or interface with other devices, services, and components that are located external to IHS 602. These devices, services, and components can interface with IHS 602 via an external network, such as network 608, using one or more communication protocols that include transport control protocol (TCP/IP) and network block device (NBD) protocol. Network 608 can be a local area network, wide area network, personal area network, and the like, and the connection to and/or between network 608 and IHS 602 can be wired, wireless, or a combination thereof. For purposes of discussion, network 608 is indicated as a single collective component for simplicity. However, it should be appreciated that network 608 can comprise one or more direct connections to other devices as well as a more complex set of interconnections as can exist within a local area network or a wide area network, such as the Internet.

A processor subsystem 612 is coupled to system memory 614 via system interconnect 616. System interconnect 616 can be interchangeably referred to as a system bus, in one or more embodiments. System interconnect 616 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 616 can also be a Double Data Rate (DDR) memory interface. The system memory 614 can either be contained on separate, removable dual inline memory module (RDIMM) devices or system memory 614 can be contained within persistent memory devices (NVDIMMs). For example, the NVDIMM-N variety of NVDIMMs contain both random access memory, which can serve as system memory 614, and non-volatile memory. It should be noted that other channels of communication can be contained within system interconnect 616, including but not limited to i2c or system management bus (SMBus). System interconnect 616 communicatively couples various system components. Examples of system components include replaceable local storage resources 618 such as solid state drives (SDDs) and hard disk drives (HDDs). Software and/or firmware modules and one or more sets of data that can be stored on local storage resources 618 and be utilized during operations of IHS 602. Specifically, in one embodiment, system memory 614 can include therein a plurality of such modules, including one or more of application(s) 620, operating system (OS) 622, a firmware interface 624 such as basic input/output system (BIOS) or Uniform Extensible Firmware Interface (UEFI), and platform firmware (FW) 626. These software and/or firmware modules have varying functionality when their corresponding program code is executed by processor subsystem 612 or secondary processing devices within IHS 600. For example, application(s) 620 may include a word processing application, a presentation application, and a management station application, among other applications.

IHS 602 further includes one or more input/output (I/O) controllers 628 that support connection by and processing of signals from one or more connected input device/s 630, such as a keyboard, mouse, touch screen, or microphone. I/O controllers 628 also support connection to and forwarding of output signals to one or more connected output devices 632, such as a monitor or display device or audio speaker(s). Additionally, in one or more embodiments, one or more device interfaces 634, such as an optical reader, a universal serial bus (USB), a card reader, Personal Computer Memory Card International Association (PCMCIA) slot, and/or a high-definition multimedia interface (HDMI), can be associated with IHS 602. Device interface(s) 634 can be utilized to enable data to be read from or stored to corresponding removable storage device/s 636, such as a compact disk (CD), digital video disk (DVD), flash drive, or flash memory card. In one or more embodiments, device interface(s) 634 can further include general purpose I/O interfaces such as inter-integrated circuit (I²C), system management bus (SMB), and peripheral component interconnect (PCI) buses.

Environmental system 604, managed by environmental controller 638, provides cooling air to meet the cooling requirements of IHSs 602 in one or more zones 640a, 640z defined within enclosure 641 of MDC 600. The cooling requirements can include specified temperature and humidity ranges for startup, standby and operation of IHSs 602. Operating outside of these ranges can degrade the service life or prevent effective operation of IHSs 602. Cooling unit(s) 644 of environmental system 604 can be stand-alone units that include air handling unit(s) 646 and evaporative/mechanical cooling subsystems 648. Compressor(s) 649 in evaporative/mechanical cooling subsystems 648 provide heat transfer. Air handling unit(s) 646 have mode actuators 650 that configure air flow for closed loop recirculation, open loop venting with cooling by outside air, or a mixed mode with partial recirculation of air. The air is moved by air mover(s) 651 of air handling unit(s) 646. Environmental controller 638 can include some or all of the components and functionality described above for IHSs 602. In one or more embodiments, environmental controller 638 acts as supervisory controller to respective control unit controllers 652 that control corresponding cooling unit(s) 642. In one or more embodiments, IHSs 602 can communicate cooling requirements to environmental controller 638, via device interface 653 or network 608, based on values provided by power consumption monitor 654, rack pressure sensor 656a, rack humidity sensor 656b, and rack temperature sensor 656c. For example, the cooling requirement can indicate a temperature set point and a current temperature. As another example, the cooling point can indicate a current heat load being produced by IHSs 602. In one or more embodiments, environmental 638 can determine cooling requirements based in part on outside environmental sensors, depicted as outside pressure sensor 658a, outside temperature sensor 660a, and outside humidity sensor 662a. In one or more embodiments, environmental controller 638 can determine cooling requirements for first zone 640a based in part on cold aisle (CA) environmental sensors in first zone 640a, depicted as CA pressure sensor 658b, CA temperature sensor 660b, and CA humidity sensor 662b. In one or more embodiments, environmental controller 638 can determine cooling requirements for first zone 640a based in part on hot aisle (HA) environmental sensors in first zone 640a, depicted as HA pressure sensor 658c, HA temperature sensor 660c, and HA humidity sensor 662c.

In one or more embodiments, environmental controller 638 can determine cooling requirements for second zone 640z based in part on CA environmental sensors in second zone 640z, depicted as CA pressure sensor 658d, CA temperature sensor 660d, and CA humidity sensor 662d. In one or more embodiments, environmental controller 638 can determine cooling requirements for second zone 640z based in part on HA environmental sensors in second zone 640z, depicted as HA pressure sensor 658e, HA temperature sensor 660e, and HA humidity sensor 662e.

7A depicts a side cutaway diagrammatic view of air flow pattern 701 through MDC 300. Volumetric container 318 includes right and left longitudinal exterior walls 320a, 320b and enclosing upper barrier 324 attached between respective upper surfaces of right and left longitudinal exterior walls 320a. Right and left longitudinal exterior walls 320a, 320b of volumetric container 318 respectively encloses right and left interior spaces 428a, 428b that respectively provide cold and hot aisles 430, 431. Right longitudinal exterior wall 320a includes supply air opening 544 and return air opening 546, which is vertically positioned above supply air opening 544.

Environmental controller 638 is communicatively coupled to environmental sensors that sense internal and external environmental conditions, such as: (i) outside pressure, temperature and humidity sensors 658a, 660a and 662a; (ii) CA pressure, temperature and humidity sensors 658b, 660b and 662b of zone 640a; (iii) HA pressure, temperature and humidity sensors 658c, 660c and 662c of zone 640a; (iv) CA pressure, temperature and humidity sensors 658d, 660d and 662d of zone 640z; (iii) HA pressure, temperature and humidity sensors 658e, 660e and 662e of zone 640z. Environmental controller 638 determines a cooling requirement of heat-generating IT component(s) 538 provided within rack(s) 536 that are positioned longitudinally within volumetric container 318 between cold aisle and hot aisles 330a, 330b. In response to determining the cooling requirement, environmental controller 638 directs cooling unit controller(s) 652 to operate air mover(s) 650 in air handling unit 104 of cooling unit 102 to create a positive pressure differential between return air inlet 110 and supply air outlet 108. Supply air 709 moves from supply air outlet 108 through supply air opening 544 into cold aisle 430a. Air flow 711 passes through racks 636 and absorbs heat from heating generating IT component(s) 538, and air flow 711 moves through to hot aisle 330b. Return air flow 713 is drawn into return air plenum 542, i.e., the air space provided above baffle 432 and below upper barrier 324, and return air flow 713 is directed to return air opening 546 of volumetric container 318. Return air flow 715 exits volumetric container 318 through vertically aligned return air opening 546 and is received by a vertically aligned rectangular opening 218 of shroud 216 that corresponds to return air opening 546. Shroud 216 redirects the horizontally/laterally received return air flow downward as air flow 717 into upwardly open return air inlet 110 of air cooling units 102.

Figure 7A:
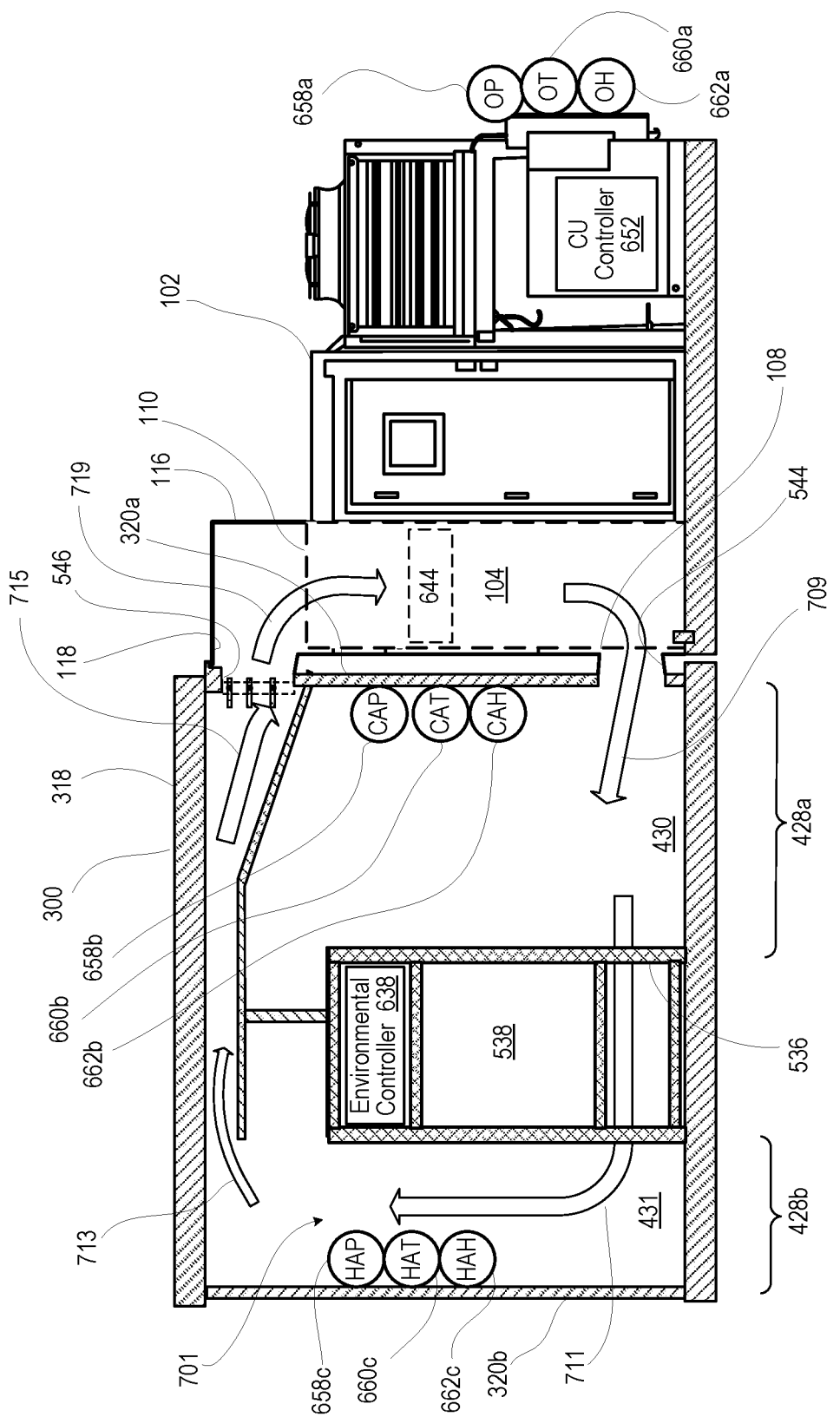
FIG. 7A is a side cutaway diagrammatic view depicting air flow through the MDC of FIG. 5, according to one or more embodiments.
Figure 7B:
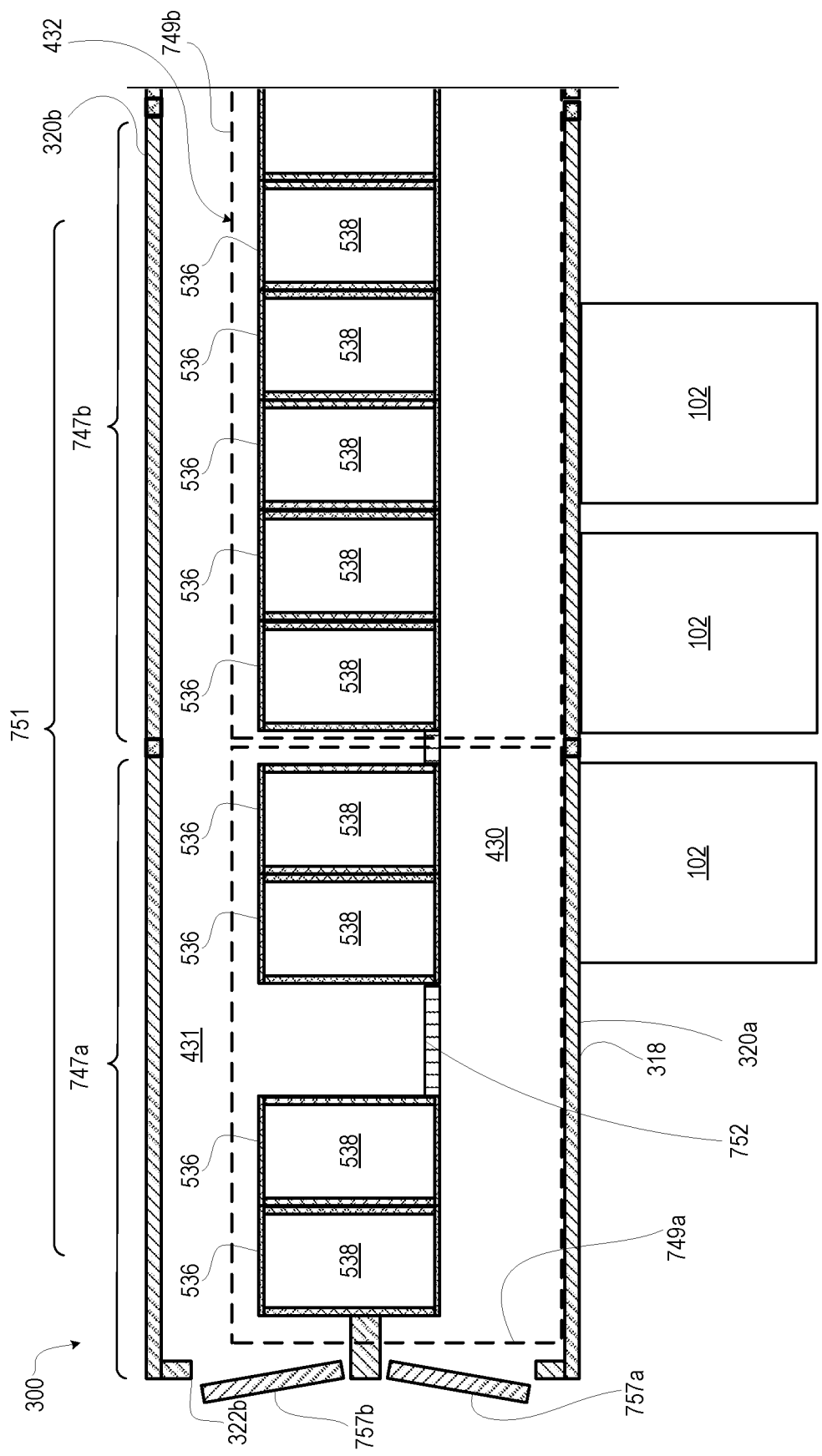
FIG. 7B is a top cutaway diagrammatic view depicting the MDC of FIG. 6 having two transportable enclosures with a baffle assembly shown in phantom line, according to one or more embodiments.

FIG. 7B is a top cutaway diagrammatic view depicting MDC 300 having two separately transportable enclosures 747a, 747b that are longitudinally attached to form volumetric container 318. First enclosure 747a includes portions of right and left longitudinal external walls 320a-320b and includes back lateral external wall 322b (FIG. 3). Second enclosure 747b includes portions of right and left longitudinal external walls 320a-320b and includes front lateral external wall 322a (FIG. 3). Baffle 432 (shown in phantom line) is assembled from baffle sections 749a-749b to extend over cold aisle 330a and a longitudinal row of rack(s) 536 that hold heat-generating IT component(s) 538 and other components. Baffle 432 does not cover hot aisle 330b. Baffle 432 directs air flow within IT compartment 751 of volumetric container 318. Rack cover panel 752 fills in a space that does not have IT component(s) 538.

FIG. 7C depicts a front cutaway diagrammatic view depicting MDC 300 having first and second enclosures 747a, 747b. Baffle 432 includes baffle segments 749a, 749b that are positioned in longitudinal succession above top surface 540 of rack 536 and coupled to volumetric container 318 beneath enclosing upper barrier 324. As one example, baffle segments 749a, 749b are coupled directly to upper barrier 324 via vertical hangers 761 and coupled indirectly via attachment(s) 756 to internal surfaces of lateral walls 332a (FIG. 3), 322b. Baffle 432 and upper barrier 324 of volumetric container 318 define return air plenum 542. Vertical air barrier 434 is formed from vertical air barrier segments 763a, 763b. Portions of baffle segments 749a, 749b can be coupled to volumetric container 318 by one or more of: attached by (i) mechanical fasteners; (ii) adhered by chemical adhesive or weld or solder; (iii) connected by intermediate structures such as brackets, etc.

Figure 8:
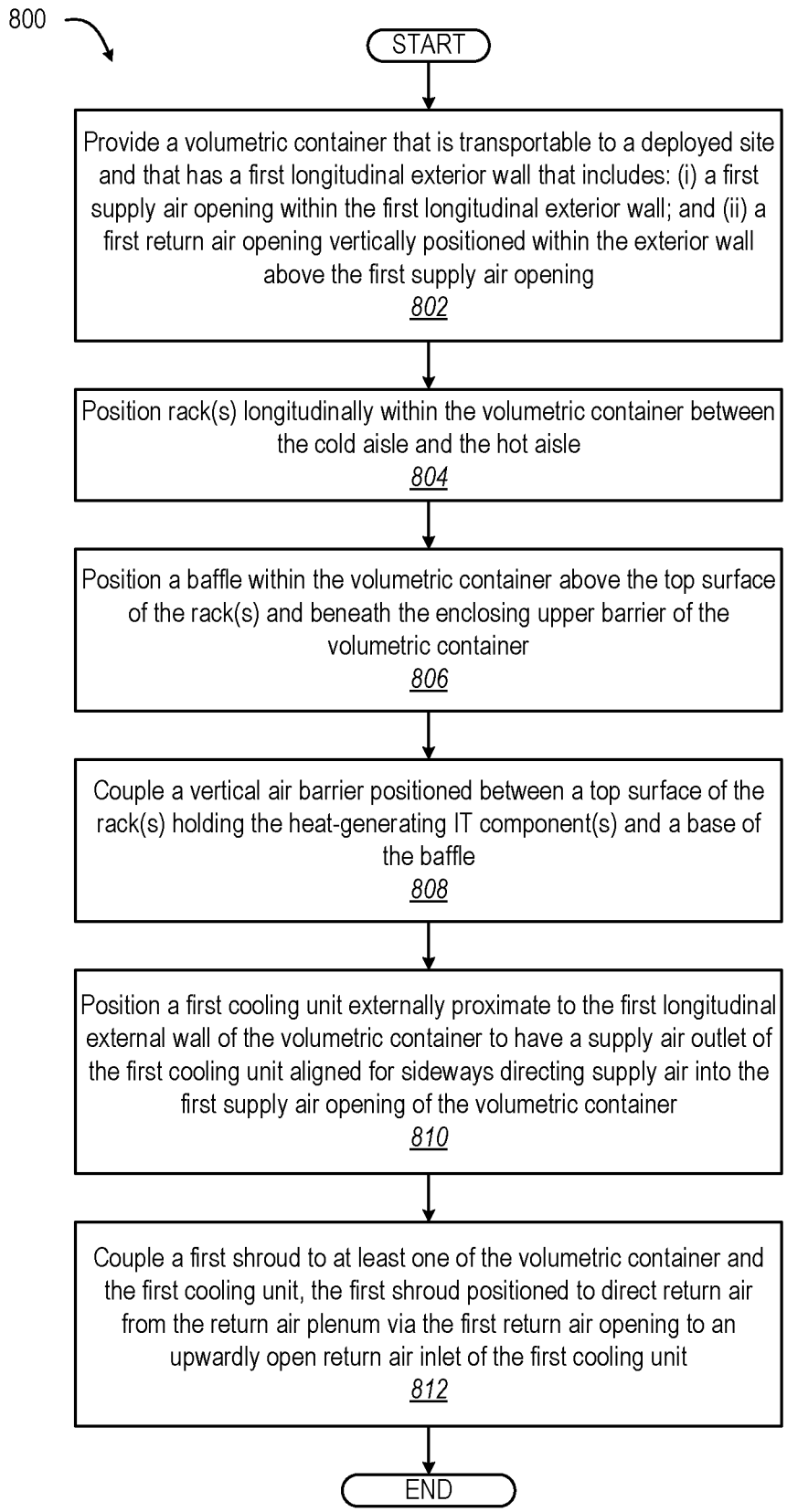
FIG. 8 provides a flow chart illustrating an example method of assembling an MDC with a side-mounted cooling system having an upwardly open return air inlet, according to one or more embodiments.

FIG. 8 depicts a flow chart illustrating example method 800 of assembling MDC 300 (FIG. 3) with side-mounted cooling system 102 having upwardly open return air inlet 110 (FIG. 1). The description of method 800 is provided with general reference to the specific components illustrated within the preceding FIGS. 1-7. In at least one embodiment, method 800 can be implemented using an automated manufacturing system under control of an IHS such as one IHS 712 (FIG. 7). Method 800 includes providing a volumetric container that is transportable to a deployed site (block 802). The volumetric container has a first longitudinal exterior wall that includes: (i) a first supply air opening within the first longitudinal exterior wall; and (ii) a first return air opening vertically positioned within the first longitudinal exterior wall above the first supply air opening. Method 800 includes positioning rack(s) longitudinally within the volumetric container between the cold aisle and the hot aisle (block 804). The rack(s) holds at least one heat-generating IT component. The rack(s) have a top surface that is lower than an enclosing upper barrier of the volumetric container, leaving an air space above the rack(s). Method 800 includes positioning a baffle within the volumetric container above the top surface of the rack(s) and beneath the enclosing upper barrier of the volumetric container (block 806). The baffle and the upper barrier of the volumetric container define a return air plenum. In one embodiment, an edge of the baffle is sealably coupled to and extend as an air barrier along the first longitudinal exterior wall to provide a separation of the cooling air entering the cold aisle via the first supply air opening from the return air exiting via the first return air opening located above the first supply air opening. The baffle extends over/across a top section of the cold aisle and separates the first supply air opening and the first return air opening. The baffle extends over the cold aisle and the rack(s) and terminates at/above/proximate to the hot aisle. The return air plenum is in fluid communication with the hot aisle, directing return air between an upper portion of the hot aisle and the first return air opening.

Method 800 includes coupling a vertical air barrier positioned between a top surface of the rack(s) holding the heat-generating IT component(s) and an undersurface of the baffle (block 808). The vertical air barrier extends longitudinally across the top of the rack(s) in the same direction as the cold aisle and blocks cooling air from passing above the rack(s) from the cold aisle to the hot aisle. The vertical air barrier directs the cooling air through the racks and over the at least one heat-generating IT component. Method 800 includes positioning a first cooling unit externally proximate to the first longitudinal external wall of the volumetric container to have a supply air outlet of the first cooling unit aligned for side-directing supply air into the first supply air opening of the volumetric container (block 810). Method 800 includes coupling a first shroud to at least one of the volumetric container and the first cooling unit. The first shroud is positioned to direct return air from the return air plenum via the first return air opening to an upwardly open return air inlet of the first cooling unit (block 812). Then method 800 ends.

In one or more embodiments, method 800 includes providing the first longitudinal external wall having a second supply air opening and a second return air opening vertically positioned above the second supply air opening within the first longitudinal external wall. The second supply air opening and a second return air opening are longitudinally spaced from the first supply and the first return air openings. Method 800 includes coupling the baffle to the first longitudinal wall to separate the second supply air opening and the second return air opening, the return air plenum directing a portion of the return air between the upper portion of the hot aisle and the second return air opening. The method 800 includes positioning a second cooling unit externally proximate to the first longitudinal external wall of the volumetric container. The second cooling unit has a supply air outlet that is side-directed into the second supply air opening of the volumetric container. The second cooling unit has a return air inlet that is upwardly open. Method 800 includes coupling a second shroud to at least one of the volumetric container and the second cooling unit. The second shroud directs return air from the return air plenum via the second return air opening to the return air inlet of the second cooling unit.

In a particular one or more embodiments, method 800 includes forming the volumetric container by attaching two or more transportable enclosures longitudinally to form the volumetric container. Method 800 includes coupling the baffle to the volumetric container by coupling each respective baffle of more than one baffle to the exterior wall in each of the two or more transportable enclosures. Then method 800 ends.

Figure 9A:
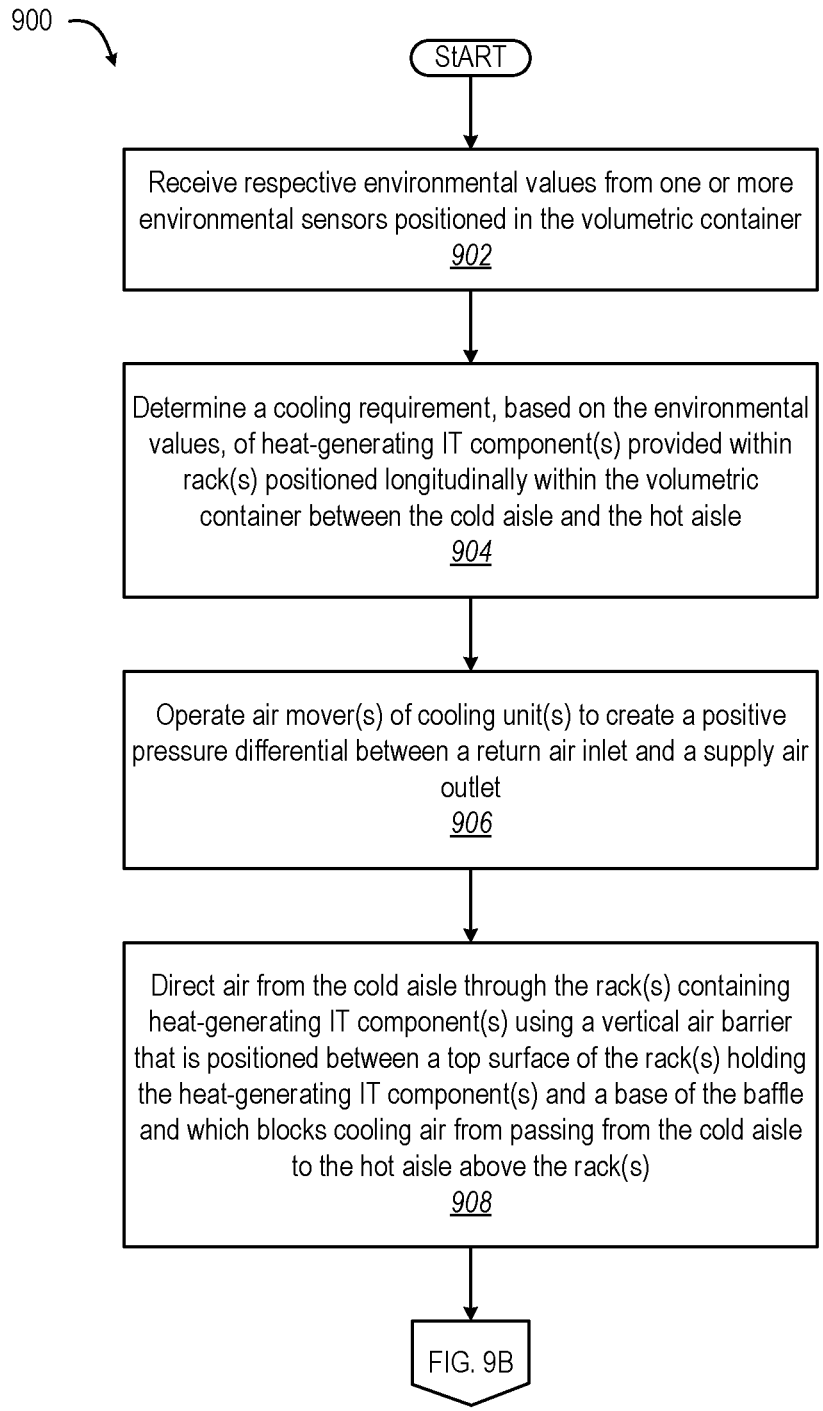
FIGS. 9A-9B (FIG. 9) provide a flow chart illustrating an example method of cooling an MDC with the side-mounted cooling system having the upwardly open return air inlet, according to one or more embodiments.
Figure 9B:
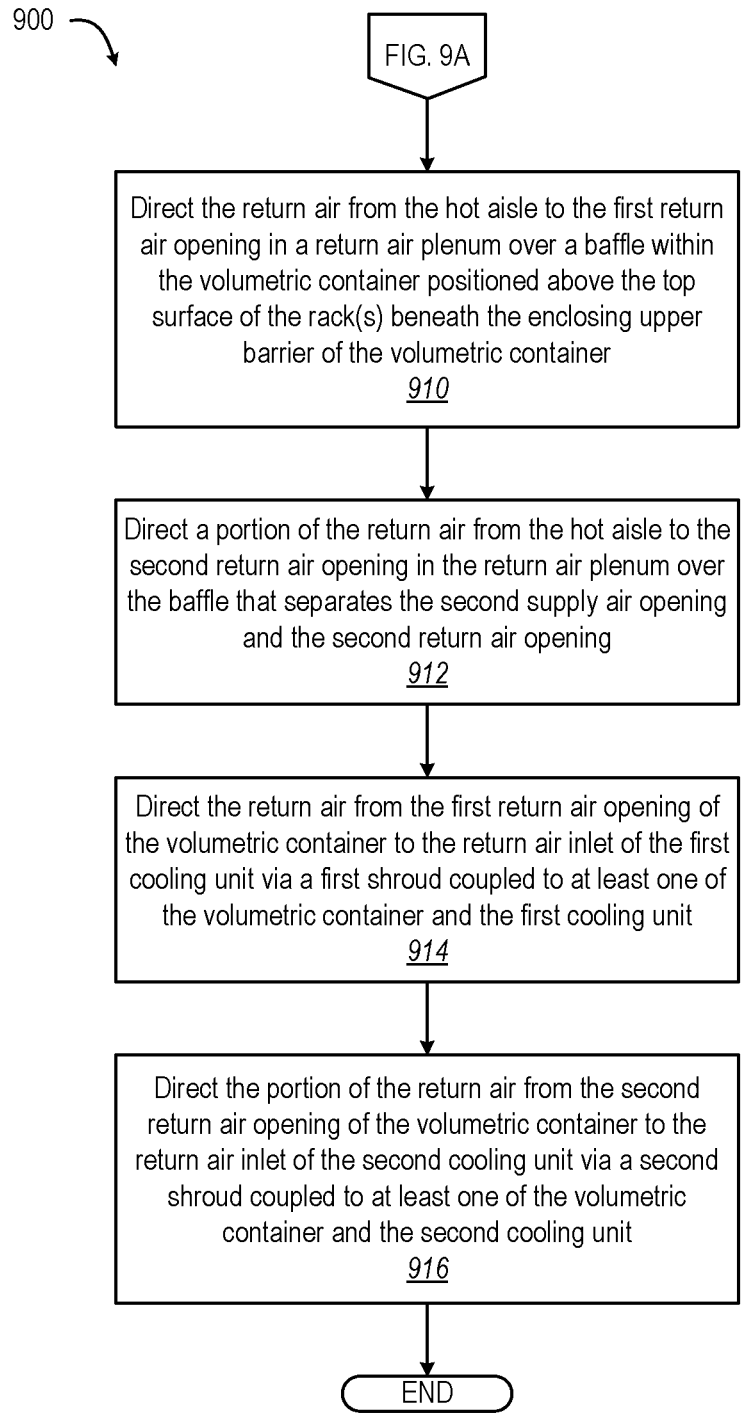

FIGS. 9A-9B (FIG. 9) depict a flow chart illustrating example method 900 of cooling MDC 300 (FIG. 3) with side-mounted cooling system 102 with upwardly open return air inlet 110 (FIG. 1). The description of the method 900 is provided with general reference to the specific components illustrated within the preceding FIGS. 1-7. In at least one embodiment, method 900 can be implemented using environmental controller 638 (FIG. 6) that operates the MDC assembled using method 800 (FIG. 8). With reference to FIG. 9A, method 900 includes receiving respective environmental values from one or more environmental sensors positioned in the volumetric container (block 902). Method 900 includes determining a cooling requirement, based on the environmental values, of heat-generating IT component(s) provided within rack(s) positioned longitudinally within the volumetric container between the cold aisle and the hot aisle (block 904). The rack(s) hold the at least one heat-generating IT component(s). The rack(s) have a top surface that is lower than the enclosing upper barrier of the volumetric container, leaving an air space above the rack(s). In response to determining the cooling requirement, method 900 includes operating air mover(s) of cooling unit(s) to create a positive pressure differential between a return air inlet and a supply air outlet (block 906). The return air inlet receives return air from first return air opening of the volumetric container and is upwardly open. The supply air outlet is sideways-directed to provide supply air to the first supply air opening of the volumetric container. Method 900 includes directing air from the cold aisle through the rack(s) containing heat-generating IT component(s) using a vertical air barrier. The vertical air barrier is positioned between a top surface of the rack(s) holding the heat-generating IT component(s) and an undersurface of the baffle. The vertical air barrier blocks cooling air from passing from the cold aisle to the hot aisle above the rack(s) (block 908).

With reference to FIG. 9B, method 900 includes directing the return air from the hot aisle to the first return air opening in a return air plenum over a baffle within the volumetric container. The baffle is positioned above the top surface of the rack(s) and beneath the enclosing upper barrier of the volumetric container (block 910). The baffle and the upper barrier of the volumetric container define the return air plenum. The baffle is coupled to and extends along the first longitudinal exterior wall, separating the first supply air opening and the first return air opening. The baffle extends over the cold aisle and the rack(s). The return air plenum is in fluid communication with the hot aisle, directing return air between an upper portion of the hot aisle and the first return air opening. Method 900 includes directing a portion of the return air from the hot aisle to the second return air opening in the return air plenum over the baffle. The baffle separates the second supply air opening and the second return air opening (block 912). Method 900 includes directing the return air from the first return air opening of the volumetric container to the return air inlet of the first cooling unit via a first shroud. The first shroud is coupled to at least one of the volumetric container and the first cooling unit (block 914). Method 900 includes directing the portion of the return air from the second return air opening of the volumetric container to the return air inlet of the second cooling unit via a second shroud. The second shroud is coupled to at least one of the volumetric container and the second cooling unit (block 916). Then method 900 ends.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A modular data center (MDC) comprising:
a volumetric container comprising a floor, a first and a second longitudinal exterior wall extending vertically upwards from the floor, and an enclosing upper barrier attached between respective upper surfaces of the first and the second longitudinal exterior walls, interior spaces extending along the first and second longitudinal exterior walls respectively define a cold aisle and a hot aisle, the first longitudinal exterior wall defines the cold aisle and comprising: (i) a first supply air opening within the first longitudinal exterior wall; and (ii) a first return air opening vertically positioned within the first exterior wall above the first supply air opening, the second interior space defines the hot aisle;
at least one heat-generating information technology (IT) component provided within at least one rack positioned longitudinally within the volumetric container between the cold aisle and the hot aisle, the at least one rack holding the at least one heat-generating IT component(s) having a top surface that is lower than the enclosing upper barrier of the volumetric container, leaving an air space above the at least one rack;

a baffle within the volumetric container and positioned above the top surface of the at least one rack, physically separating the first supply air opening and the first return air opening, the baffle extending over the cold aisle and the at least one rack, a return air plenum in fluid communication with the hot aisle, directing return air between an upper portion of the hot aisle and the first return air opening;

a first cooling unit externally positioned proximate to the first longitudinal external wall of the volumetric container, the first cooling unit having a supply air outlet that is sideways directed into the first supply air opening of the volumetric container, and the first cooling unit having a return air inlet that is upwardly open; and a first shroud coupled to at least one of the volumetric container and the first cooling unit and that directs return air from the return air plenum via the first return air opening to the return air inlet of the first cooling unit.

2. The MDC of claim 1, further comprising:

a second supply air opening and a second return air opening vertically positioned above the second supply air opening within the first longitudinal external wall and longitudinally spaced from the first supply and the first return air openings;

wherein the baffle separates the second supply air opening and the second return air opening, the return air plenum directing a portion of the return air between the upper portion of the hot aisle and the second return air opening;

a second cooling unit externally positioned proximate to the first longitudinal external wall of the volumetric container, the second cooling unit having a supply air outlet that is sideways directed into the second supply air opening of the volumetric container, and the second cooling unit having a return air inlet that is upwardly open; and a second shroud coupled to at least one of the volumetric container and the second cooling unit and that directs return air from the return air plenum via the second return air opening to the return air inlet of the second cooling unit.

3. The MDC of claim 1, wherein the baffle comprises a vertical air barrier positioned between a top surface of the at least one rack holding the at least one heat-generating IT component and an undersurface of the baffle and which blocks cooling air from passing from the cold aisle to the hot aisle above the at least one rack and direct the cooling air over the at least one heat-generating IT component.

4. The MDC of claim 1, wherein:

the volumetric container is transportable to a deployed site;

the first cooling unit is palletized for transport to the deployed site; and the first shroud is attachable at the deployed site to the at least one of the volumetric container and the cooling unit.

5. The MDC of claim 4, wherein:

the volumetric container comprises two or more transportable enclosures that are attached at the deployed site; and the baffle comprises more than one baffle, each of the two or more transportable enclosures comprising a corresponding one of the more than one baffle.

6. A method comprising:

defining within a volumetric container a cold aisle adjacent to a first longitudinal exterior wall and a hot aisle adjacent to a second longitudinal exterior wall, opposed from the first longitudinal exterior wall and having a first supply air opening and a first return air opening that is vertically positioned within the first exterior wall above the first supply air opening;

positioning at least one rack longitudinally within the volumetric container between the cold aisle and the hot aisle, the at least one rack having a top surface that is lower than an upper barrier of the volumetric container, leaving an air space above the at least one rack;

installing a baffle within the volumetric container in a position extending from above the top surface of the at least one rack, physically separating the first supply air opening and the first return air opening, the baffle extending over the cold aisle and the at least one rack, a space above the baffle providing a return air plenum in fluid communication with the hot aisle, directing return air between an upper portion of the hot aisle and the first return air opening;

positioning a first cooling unit externally proximate to the first longitudinal external wall of the volumetric container, the first cooling unit having a supply air outlet that is sideways directed into the first supply air opening of the volumetric container and having a return air inlet that is upwardly open; and coupling a first shroud to extend from the return air opening at the first longitudinal exterior wall of the volumetric container to above the return air inlet of the first cooling unit, providing fluid communication between the volumetric container and the first cooling unit, the first shroud directing return air from the return air plenum via the first return air opening to the return air inlet of the first cooling unit.

7. The method of claim 6, further comprising:

installing the baffle within the volumetric container in a position extending from above the top surface of the at least one rack to physically attach to the first longitudinal exterior wall, physically separating a second supply air opening and a second return air opening that are vertically aligned and that are longitudinally spaced from the first supply air opening and the first return air opening;

positioning a second cooling unit externally proximate to the first longitudinal external wall of the volumetric container, the second cooling unit having a supply air outlet that is sideways directed into the first supply air opening of the volumetric container and having a return air inlet that is upwardly open; and coupling a second shroud to extend from the return air opening at the first longitudinal exterior wall of the volumetric container to above the return air inlet of the second cooling unit, providing fluid communication between the volumetric container and the second cooling unit, the second shroud directing return air from the return air plenum via the first return air opening to the return air inlet of the second cooling unit.

8. The method of claim 6, further comprising coupling a vertical air barrier positioned between a top surface of the at least one rack configured to hold at least one heat-generating IT component and an undersurface of the baffle and which blocks cooling air from passing from the cold aisle to the hot aisle above the at least one rack and direct the cooling air over the at least one heat-generating IT component.

9. The method of claim 6, further comprising:
positioning the first cooling unit proximate to the volumetric container using a pallet moving vehicle; and
attaching the first shroud to the at least one of the volumetric container and the cooling unit.

10. The method of claim 9, further comprising:
transporting the volumetric container to the deployed site comprises:
   transporting two or more transportable enclosures to the deployed site; and
longitudinally attaching two or more transportable enclosures to form the volumetric container; and
coupling the baffle to the volumetric container comprises coupling a respective baffle of more than one baffle in each of the two or more transportable enclosures.

11. A method comprising:
providing a volumetric container comprising a first and a second longitudinal exterior wall and an enclosing upper barrier attached between respective upper surfaces of the first and the second longitudinal exterior walls, the volumetric container enclosing a first and a second interior space, the first interior space adjacent to the first longitudinal exterior wall providing a cold aisle and comprising: (i) a first supply air opening within the first longitudinal exterior wall; and (ii) a first return air opening vertically positioned within the exterior wall above the first supply air opening, the second interior space providing a hot aisle;
determining a cooling requirement of at least one heat-generating information technology (IT) component provided within at least one rack positioned longitudinally within the volumetric container between the cold aisle and the hot aisle, the at least one rack holding the at least one heat-generating IT component(s) having a top surface that is lower than the enclosing upper barrier of the volumetric container, leaving an air space above the at least one rack;
in response to determining the cooling requirement, operating one or more air movers of a first cooling unit to create a positive pressure differential between a return air inlet that receives return air from first return air opening of the volumetric container and that is upwardly open and a supply air outlet that is sideways directed to provide supply air to the first supply air opening of the volumetric container to move from the cold aisle to the hot aisle via to remove heat from the at least one heat-generating IT component;
directing the return air from the hot aisle to the first return air opening in a return air plenum over a baffle positioned above the top surface of the at least one rack, physically separating the first supply air opening and the first return air opening, the baffle extending over the cold aisle and the at least one rack, the return air plenum in fluid communication with the hot aisle, directing return air between an upper portion of the hot aisle and the first return air opening; and
directing the return air from the first return air opening of the volumetric container to the return air inlet of the first cooling unit via a first shroud coupled to at least one of the volumetric container and the first cooling unit.

12. The method of claim 11, further comprising:
receiving respective environmental values from one or more environmental sensors positioned in the volumetric container; and
determining the cooling requirement based on the environmental values.

13. The method of claim 11, further comprising:
providing the volumetric container comprising a second supply air opening and a second return air opening vertically positioned above the second supply air opening within the first longitudinal external wall and longitudinally spaced from the first supply and the first return air openings;
directing a portion of the return air from the hot aisle to the second return air opening in the return air plenum over the baffle that separates the second supply air opening and the second return air opening; and
directing the portion of the return air from the second return air opening of the volumetric container to the return air inlet of the second cooling unit via a second shroud coupled to at least one of the volumetric container and the second cooling unit.

14. The method of claim 11, further comprising directing air from the cold aisle through the at least one rack containing at least one IT component using a vertical air barrier of the baffle that is positioned between a top surface of the at least one rack holding the at least one heat-generating IT component and an undersurface of the baffle and which blocks cooling air from passing from the cold aisle to the hot aisle above the at least one rack.

* * * * *